United States Patent
Xiao et al.

(10) Patent No.: US 11,043,374 B2
(45) Date of Patent: Jun. 22, 2021

(54) SILACYCLOALKANE COMPOUNDS AND METHODS FOR DEPOSITING SILICON CONTAINING FILMS USING SAME

(71) Applicant: Versum Materials US, LLC, Tempe, AZ (US)

(72) Inventors: Manchao Xiao, San Diego, CA (US); Robert Gordon Ridgeway, Chandler, AZ (US); Daniel P. Spence, Carlsbad, CA (US); Xinjian Lei, Vista, CA (US); Raymond Nicholas Vrtis, Carefree, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/549,634

(22) Filed: Aug. 23, 2019

(65) Prior Publication Data
US 2020/0075323 A1    Mar. 5, 2020

Related U.S. Application Data

(60) Provisional application No. 62/722,241, filed on Aug. 24, 2018.

(51) Int. Cl.
*H01L 21/02* (2006.01)
*C07F 7/18* (2006.01)

(52) U.S. Cl.
CPC .......... *H01L 21/02216* (2013.01); *C07F 7/18* (2013.01); *H01L 21/02126* (2013.01); *H01L 21/02203* (2013.01); *H01L 21/02274* (2013.01); *H01L 21/02348* (2013.01)

(58) Field of Classification Search
None
See application file for complete search history.

(56) References Cited

U.S. PATENT DOCUMENTS

| | | | | |
|---|---|---|---|---|
| 3,433,819 A | * | 3/1969 | Braun | C10M 3/00 556/464 |
| 4,675,426 A | * | 6/1987 | Crivello | C07F 7/1804 556/464 |
| 2011/0068332 A1 | * | 3/2011 | Han | H01L 29/78669 257/40 |
| 2011/0180789 A1 | * | 7/2011 | Han | H01L 29/4908 257/40 |
| 2015/0364321 A1 | * | 12/2015 | Vrtis | H01L 21/02203 438/759 |
| 2016/0336190 A1 | * | 11/2016 | Kikuchi | C23C 16/401 |
| 2019/0134663 A1 | * | 5/2019 | Lei | H01L 21/02203 |
| 2019/0385840 A1 | * | 12/2019 | Ridgeway | H01L 21/02126 |

OTHER PUBLICATIONS

Day, Roberta O., et al., "Anionic Five-Coordinated Cyclic Organofluorosilicates Varying in Ring Size from Five- to Seven-Membered" in Organometallics, 1991, 10, pp. 1758-1766 (Year: 1991).*

* cited by examiner

*Primary Examiner* — Erik Kielin
(74) *Attorney, Agent, or Firm* — David K. Benson

(57) ABSTRACT

A method and composition for producing a low k dielectric film via plasma enhanced chemical vapor deposition comprise the steps of: providing a substrate within a reaction chamber; introducing into the reaction chamber gaseous reagents including at least one structure-forming precursors comprising a silacycloalkane compound, an oxygen source, and optionally a porogen; applying energy to the gaseous reagents in the reaction chamber to induce reaction of the gaseous reagents to deposit a low k dielectric film having dielectric constant of 3.2 or less. In certain embodiments, the structure-forming precursor further comprises a hardening additive.

23 Claims, No Drawings

SILACYCLOALKANE COMPOUNDS AND METHODS FOR DEPOSITING SILICON CONTAINING FILMS USING SAME

CROSS-REFERENCE TO RELATED APPLICATIONS

This application claims priority to U.S. provisional application 62/722,241 filed on Aug. 24, 2018, the entire contents of which is incorporated herein by reference thereto for all allowable purposes.

BACKGROUND OF THE INVENTION

Described herein are compositions and methods for the formation of a dielectric film using silacycloalkane compounds as a structure forming precursor(s). More specifically, described herein is a composition and method for formation of a porous low dielectric constant ("low k" film or film having a dielectric constant of about 3.2 or less) film wherein the method used to deposit the film is a chemical vapor deposition (CVD) method. The dielectric films produced by the compositions and methods described herein can be used, for example, as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants ranging from about 2.7 to about 3.5. This organosilica glass is typically deposited as a dense film (density ~1.5 g/cm$^3$) from an organosilicon precursor, such as a methylsilane or siloxane, and an oxidant, such as $O_2$ or $N_2O$. Organosilica glass will be herein be referred to as OSG. As dielectric constant or "k" values drop below 2.7 with higher device densities and smaller dimensions, the industry has exhausted most of the suitable low k compositions for dense films and has turned to various porous materials for improved insulating properties.

Patents, published applications, and publications in the field of porous ILD by CVD methods field include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, V. Appl. Phys. Lett. (2001), 79(6), pp. 803-805, which all teach the co-deposition of a film from an organosilicon precursor and an organic compound, and subsequent thermal anneal to provide a multiphase OSG/organic film in which a portion of the polymerized organic component is retained. In the latter references, the ultimate final composition of the films indicate residual porogen and a high hydrocarbon film content of approximately 80 to 90 atomic %. Further, the final films retain the $SiO_2$-like network, with substitution of a portion of oxygen atoms for organic groups.

A challenge, which has been recognized in the industry, is that films with lower dielectric constants typically have higher porosity, which leads to enhanced diffusion of species into the films, specifically gas phase diffusion. This increased diffusion can result in increased removal of carbon from the porous OSG film from processes such as etching of the film, plasma ashing of photoresist, and $NH_3$ plasma treatment of copper surfaces. Carbon depletion in the OSG films can cause one or more of the following problems: an increase in the dielectric constant of the film; film etching and feature bowing during wet cleaning steps; moisture absorption into the film due to loss of hydrophobicity, pattern collapse of fine features during the wet clean steps after pattern etch and/or integration issues when depositing subsequent layers such as, without limitation, copper diffusion barriers, for example Ta/TaN or advanced Co or MnN barrier layers.

Possible solutions to one or more of these problems are to use porous OSG films with increased carbon content. A first approach is to use a porogen which results in a higher retention of Si-Methyl (Me) groups in the porous OSG layer. Unfortunately, the relationship between increasing Si-Me content typically leads to decreasing mechanical properties, thus the films with more Si-Me will negatively impact mechanical strength which is important for integration. A second approach has been to use a damage resistant porogen (DRP), such as, for example, the porogen disclosed in U.S. Pat. No. 8,753,985, which leaves additional amorphous carbon behind in the film after UV curing. In certain cases, this residual carbon does not negatively impact the dielectric constant nor the mechanical strength. It is difficult, however, to get significantly higher carbon contents in these films using the DRP.

Yet another solution proposed has been to use ethylene or methylene bridged disiloxanes of the general formula $R_x(RO)_{3-x}Si(CH_2)_ySiR_z(OR)_{3-z}$ where x=0-3, y=1 or 2, z=0-3. The use of bridged species is believed to avoid the negative impact to the mechanical properties by replacing bridging oxygen with a bridging carbon chain since the network connectivity will remain the same. This arises from the belief that replacing bridging oxygen with a terminal methyl group will lower mechanical strength by lowering network connectivity. In this manner one, can replace an oxygen atom with 1-2 carbon atoms to increase the atomic weight percent (%) C without lowering mechanical strength. These bridged precursors, however, generally have very high boiling points due to the increased molecular weight from having two silicon groups. The increased boiling point may negatively impact the manufacturing process by making it difficult to deliver the chemical precursor into the reaction chamber as a gas phase reagent without condensing it in the vapor delivery line or process pump exhaust.

Thus, there is a need in the art for a dielectric precursor that provides a film with increased carbon content upon deposition yet does not suffer the above-mentioned drawbacks.

BRIEF SUMMARY OF THE INVENTION

The method and composition described herein fulfill one or more needs described above. The method and composition described herein use a silacycloalkane compound(s) such as, for example, (1,2-ethanedioxy)-1-silacyclopentane or (1-methyl-1,2-ethanedioxy)-1-silacyclopentane, as the structure forming precursor which after co-deposition with or without a porogen precursor and, after UV curing to remove the porogen and harden the as-deposited film, provides a porous low k dielectric film that has similar or better mechanical properties as the films that use a prior art structure forming precursor such as diethoxymethylsilane (DEMS) at the same dielectric constant. Further, the films deposited using the silacycloalkane compounds described herein as the structure forming precursor(s) comprise a relatively higher amount of carbon. In addition, the silacycloalkane compound(s) described herein have a lower molecular weight (MW) relative to other prior art structure-forming precursors such as bridged precursors, (e.g., disilane or disiloxane precursors) which by nature of having 2 silicon groups have a higher MW and higher boiling points, thereby making the silacycloalkane precursors described herein more convenient to process, for example, in a high volume manufacturing process.

Described herein is a porous dielectric film comprising: a material represented by the formula $Si_vO_wC_xH_yF_z$, where v+w+x+y+z=100%, v is from 10 to 35 atomic %, w is from 10 to 65 atomic %, x is from 5 to 45 atomic %, y is from 10 to 50 atomic % and z is from 0 to 15 atomic %, wherein the film has pores with a volume porosity of 5.0 to 30.0%, a dielectric constant of 2.3 to 3.2 and mechanical properties such as hardness of 1.0 to 7.0 and elastic modulus of 4.0 to 40.0. In certain embodiments, the film comprises a higher carbon content (10-40%) as measured by X-ray photospectrometry (XPS) and exhibits a decreased depth of carbon removal when exposed to, for example an $O_2$ or $NH_3$ plasma as measured by examining the carbon content determined by XPS depth profiling.

In one aspect, there is provided a method for producing a dielectric film represented by the formula $Si_vO_wC_xH_yF_z$, where v+w+x+y+z=100%, v is from 10 to 35 atomic %, w is from 10 to 65 atomic %, x is from 5 to 40 atomic %, y is from 10 to 50 atomic % and z is from 0 to 15 atomic %, said method comprising: providing a substrate within a reaction chamber; introducing into the reaction chamber gaseous reagents comprising at least one structure-forming precursor comprising a silacycloalkane compound of Formula I

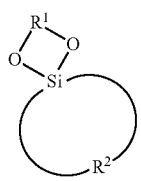

(I)

wherein $R^1$ is selected from a linear or branched $C_2$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^2$ is selected from a linear or branched $C_3$ to $C_{10}$ alkylene which forms a four-membered, five-membered, or six-membered saturated cyclic ring with the Si atom; applying energy to the gaseous reagents in the reaction chamber to induce reaction of the gaseous reagents to deposit a preliminary film on the substrate, and removing from the preliminary film at least a portion of the porogen to provide the porous dielectric film comprising pores and a dielectric constant of about 3.2 or less.

In another aspect, there is provided a method for producing a dielectric film represented by the formula $Si_vO_wC_xH_yF_z$, where v+w+x+y+z=100%, v is from 10 to 35 atomic %, w is from 10 to 65 atomic %, x is from 5 to 40 atomic %, y is from 10 to 50 atomic % and z is from 0 to 15 atomic %, said method comprising: providing a substrate within a reaction chamber; introducing into the reaction chamber gaseous reagents comprising at least one structure-forming precursor comprising a silacycloalkane compound of Formula I

(I)

wherein $R^1$ is selected from a linear or branched $C_2$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^2$ is selected from a linear or branched $C_3$ to $C_{10}$ alkylene which forms a four-membered, five-membered, or six-membered saturated cyclic ring with the Si atom, optionally at least one oxygen source, and optionally a hardening additive; applying energy to the gaseous reagents in the reaction chamber to induce reaction of the gaseous reagents to deposit a preliminary film on the substrate, wherein the preliminary film contains the porogen; and removing from the preliminary film at least a portion of the porogen to provide the porous dielectric film comprising pores and a dielectric constant of about 2.6 or less.

In yet, another aspect, there is provided a composition for a vapor deposition of a dielectric film comprising at least one silacycloalkane compound having the following Formula I

(I)

wherein $R^1$ is selected from a linear or branched $C_2$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^2$ is selected from a linear or branched $C_3$ to $C_{10}$ alkylene which forms a four-membered, five-membered, or six-membered saturated cyclic ring with the Si atom and wherein the compound is substantially free of one or more impurities selected from the group consisting of a halide, water, and combinations thereof.

DETAILED DESCRIPTION OF THE INVENTION

Described herein is a chemical vapor deposition (CVD) method for producing the porous low k dielectric film, comprising: providing a substrate within a reaction chamber; introducing into the reaction chamber gaseous reagents including at least one structure-forming precursor comprising a silacycloalkane compound such as, for example, (1,2-ethanedioxy)-1-silacyclopentane or (1-methyl-1,2-ethanedioxy)-1-silacyclopentane, an oxygen source, and optionally a porogen; applying energy to the gaseous reagents in the reaction chamber to induce reaction of the gaseous reagents to deposit a preliminary film on the substrate, wherein the preliminary film contains the porogen and the organosilicate glass; and removing from the preliminary film substantially all of the porogen to provide the porous film with pores and a dielectric constant less than 3.2.

The silacycloalkane compounds described herein provide unique attributes that make it possible for one to incorporate more carbon content in the dielectric film with minor impact on the mechanical properties of the dielectric film compared to prior art structure forming precursors such as diethoxymethylsilane (DEMS). For example, DEMS provides a mixed ligand system in DEMS with two alkoxy groups, one methyl and one hydride which offers a balance of reactive sites and allows for the formation of more mechanically robust films while retaining the desired dielectric constant. While not intending to be bound by any particular theory, the silacycloalkane precursors described herein such as (1,2-ethanedioxy)-1-silacyclopentane or (1-methyl-1,2-ethanedioxy)-1-silacyclopentane may offer advantages over more symmetric precursors such as 1,1-dimethyl-1-silacyclopentane or 1,1-diethoxy-1-silacyclopent-3-ene which have been proposed. The incorporation of one alkyl and one alkoxy group of the structure-forming precursor(s) described herein allows for a balance of mechanical strength and carbon incorporation at dielectric constant of 3.2 or less.

The low k dielectric films are organosilica glass ("OSG") films or materials. Organosilicates are candidates for low k materials, but without the addition of porogens to add porosity to these materials, their inherent dielectric constant is limited to as low as 3.2. The addition of porosity, where the void space has an inherent dielectric constant of 1.0, reduces the overall dielectric constant of the film, generally at the cost of mechanical properties. Material properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. The method and composition described herein provides the means to generate porous low k dielectric films that have a desirable balance of electrical and mechanical properties as well as other beneficial film properties as high carbon content to provide improved integration plasma resistance.

In certain embodiments of the method and composition described herein, a layer of silicon-containing dielectric material is deposited on at a least a portion of a substrate via a chemical vapor deposition (CVD) process employing a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

In certain embodiments, the layer of silicon-containing dielectric material is deposited on at least a portion of the substrate by introducing into the reaction chamber gaseous reagents including at least one structure-forming precursor comprising a silacycloalkane compound with or without a porogen precursor. In other embodiments, the layer of silicon-containing dielectric material is deposited on at least a portion of the substrate by introducing into the reaction chamber gaseous reagents including at least one structure-forming precursor comprising a silacycloalkane compound with a hardening additive.

The method and composition described herein employ a silacycloalkane compound having the following Formula I

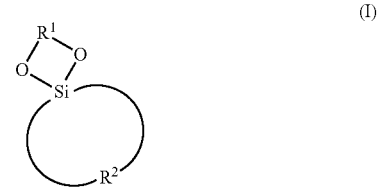

wherein $R^1$ is selected from a linear or branched $C_2$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^2$ is selected from a linear or branched $C_3$ to $C_{10}$ alkylene which forms a four-membered, five-membered, or six-membered saturated cyclic ring with the Si atom.

In the formula above and throughout the description, the term "alkyl" denotes a linear or branched functional group having from 1 to 10 carbon atoms. Exemplary linear alkyl groups include, but are not limited to, methyl, ethyl, n-propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group such as methoxy, ethoxy, iso-propoxy, and n-propoxy, a dialkylamino group such as dimethylamino or combinations thereof, attached thereto. In other embodiments, the alkyl group does not have one or more functional groups attached thereto. The alkyl group may be saturated or, alternatively, unsaturated.

In Formula I above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In Formula I above and throughout the description, the term "hetero-cyclic" denotes a $C_3$ to $C_{10}$ hetero-cyclic alkyl group such as, for example, an epoxy group.

In Formula I above and throughout the description, the term "alkenyl group" denotes a group which has one or more carbon-carbon double bonds and has from 2 to 10 or from 2 to 10 or from 2 to 6 carbon atoms.

In Formula I above and throughout the description, the term "alkynyl group" denotes a group which has one or more carbon-carbon triple bonds and has from 3 to 10 or from 2 to 10 or from 2 to 6 carbon atoms.

In Formula I above and throughout the description, the term "aryl" denotes an aromatic cyclic functional group having from 5 to 10 carbon atoms, or from 6 to 10 carbon atoms.

Exemplary aryl groups include, but are not limited to, phenyl, benzyl, chlorobenzyl, tolyl, and o-xylyl.

In Formula I above and throughout the description, the term "hetero-aryl" denotes a $C_3$ to $C_{10}$ hetero-cyclic aryl group 1,2,3-triazolyl, pyrrolyl, and furanyl.

In Formula I above and throughout the description, the term "alkylene" denotes a $C_3$ to $C_{10}$ diradical which bonded to Si atom to form a four-membered, five-membered, or six-membered cyclic ring with the Si atom. Exemplary alkylene groups include, but not limited to, propylene (—$CH_2CH_2CH_2$—), n-butylene (—$CH_2CH_2CH_2CH_2$—), and n-pentylene (—$CH_2CH_2CH_2CH_2CH_2$—).

In some embodiments, Formula I above when substituent $R^2$ is a $C_3$ to $C_{10}$ alkylene forms a four-membered, five-membered, or six-membered cyclic ring with the Si atom. As the skilled person will understand, $R^2$ is a substituted or unsubstituted hydrocarbon chain which links with the Si atom together to form a ring in Formula I wherein the ring is a four-membered, five-membered, or six-membered ring. In these embodiments, the ring structure can be a saturated ring such as, for example, a cyclic alkyl ring. Exemplary of saturated rings include, but are not limited to, silacyclobutane, silacyclopentane, and silacyclohexane.

Throughout the description, the term "silacycloalkane" refers to a compound that has two cyclic rings connected to a silicon atom wherein one cyclic ring has one silicon atom and no carbon-carbon double bonds and the other cyclic ring has two Si—O bonds in the ring structure.

Throughout the description, the term "oxygen source" refers to a gas comprising oxygen ($O_2$), a mixture of oxygen and helium, a mixture of oxygen and argon, carbon dioxide, carbon monoxide and combination thereof.

Throughout the description, the term "dielectric film" refers to a film comprising silicon and oxygen atoms having composition of $Si_vO_wC_xH_yF_z$, wherein v+w+x+y+z=100%, v is from 10 to 35 atomic %, w is from 10 to 65 atomic %, x is from 5 to 40 atomic %, y is from 10 to 50 atomic % and z is from 0 to 15 atomic %.

In certain embodiments of Formula I, $R^1$ is selected from the group consisting of linear or branched $C_2$ to $C_6$ alkyl to form a four-membered, five-membered, or six-membered saturated cyclic ring with the two oxygen atoms and $R^2$ forms a four-membered, five-membered, or six-membered saturated cyclic ring with the Si atom. Examples of these embodiments are as follows:

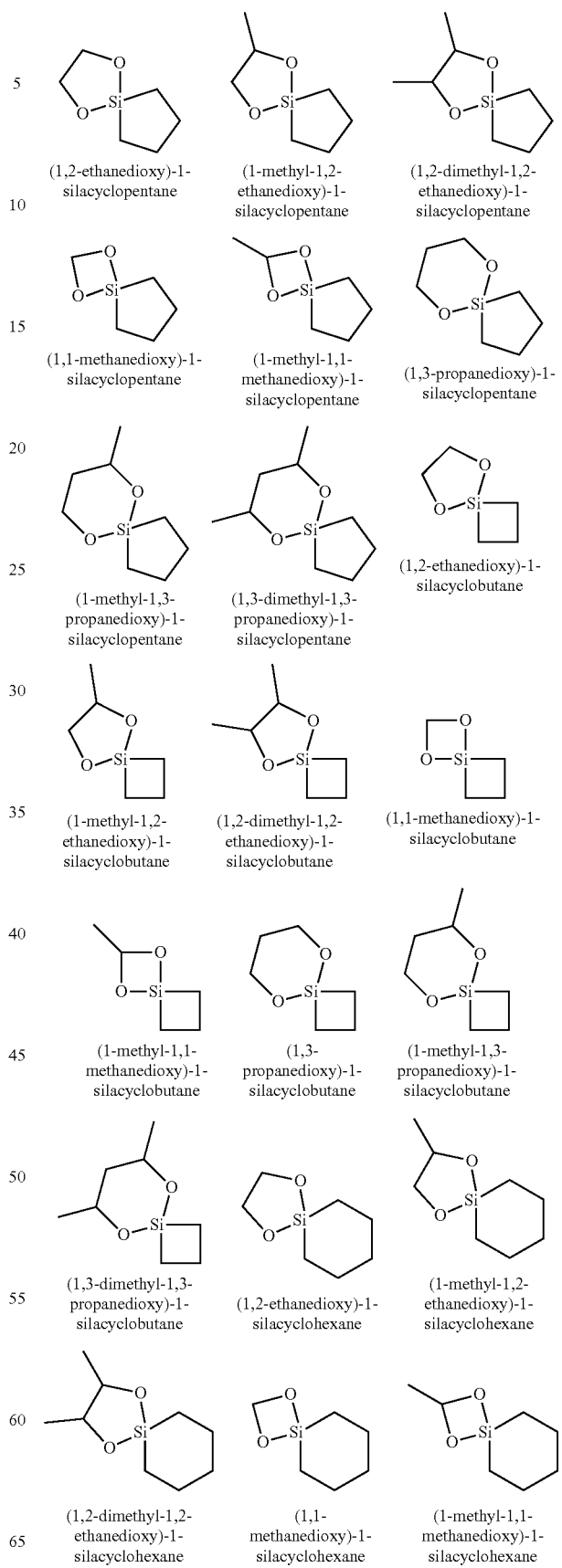

(1,2-ethanedioxy)-1-silacyclopentane (1-methyl-1,2-ethanedioxy)-1-silacyclopentane (1,2-dimethyl-1,2-ethanedioxy)-1-silacyclopentane (1,1-methanedioxy)-1-silacyclopentane (1-methyl-1,1-methanedioxy)-1-silacyclopentane (1,3-propanedioxy)-1-silacyclopentane (1-methyl-1,3-propanedioxy)-1-silacyclopentane (1,3-dimethyl-1,3-propanedioxy)-1-silacyclopentane (1,2-ethanedioxy)-1-silacyclobutane (1-methyl-1,2-ethanedioxy)-1-silacyclobutane (1,2-dimethyl-1,2-ethanedioxy)-1-silacyclobutane (1,1-methanedioxy)-1-silacyclobutane (1-methyl-1,1-methanedioxy)-1-silacyclobutane (1,3-propanedioxy)-1-silacyclobutane (1-methyl-1,3-propanedioxy)-1-silacyclobutane (1,3-dimethyl-1,3-propanedioxy)-1-silacyclobutane (1,2-ethanedioxy)-1-silacyclohexane (1-methyl-1,2-ethanedioxy)-1-silacyclohexane (1,2-dimethyl-1,2-ethanedioxy)-1-silacyclohexane (1,1-methanedioxy)-1-silacyclohexane (1-methyl-1,1-methanedioxy)-1-silacyclohexane -continued

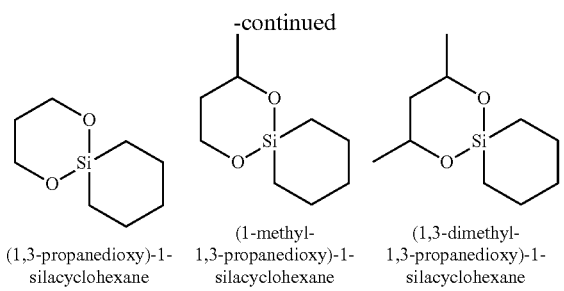

(1,3-propanedioxy)-1-silacyclohexane
(1-methyl-1,3-propanedioxy)-1-silacyclohexane
(1,3-dimethyl-1,3-propanedioxy)-1-silacyclohexane In some embodiments, the composition and method described herein employ at least one silacycloalkane compound selected from the group consisting of (1,2-ethanedioxy)-1-silacyclopentane, (1-methyl-1,2-ethanedioxy)-1-silacyclopentane, (1,2-dimethyl-1,2-ethanedioxy)-1-silacyclopentane, (1,1-methanedioxy)-1-silacyclopentane, (1-methyl-, 1-methanedioxy)-1-silacyclopentane, (1,3-propanedioxy)-1-silacyclopentane, (1-methyl-1,3-propanedioxy)-1-silacyclopentane, (1,3-dimethyl-1,3-propanedioxy)-1-silacyclopentane, (1,2-ethanedioxy)-1-silacyclobutane, (1-methyl-1,2-ethanedioxy)-1-silacyclobutane, (1,2-dimethyl -1,2-ethanedioxy)-1-silacyclobutane, (1,1-methanedioxy)-1-silacyclobutane, (1-methyl-1,1-methanedioxy)-1-silacyclobutane, (1,3-propanedioxy)-1-silacyclobutane, (1-methyl-1,3-propanedioxy)-1-silacyclobutane, (1,3-dimethyl-1,3-propanedioxy)-1-silacyclobutane, (1,2-ethanedioxy)-1-silacyclohexane, (1-methyl-1,2-ethanedioxy)-1-silacyclohexane, (1,2-dimethyl -1,2-ethanedioxy)-1-silacyclohexane, (1,1-methanedioxy)-1-silacyclohexane, (1-methyl-1,1-methanedioxy)-1-silacyclohexane, (1,3-propanedioxy)-1-silacyclohexane, (1-methyl-1,3-propanedioxy)-1-silacyclohexane, and (1,3-dimethyl-1,3-propanedioxy)-1-silacyclohexane.

The silacycloalkane compounds described herein and methods and compositions comprising same are preferably substantially free of one or more impurities such as without limitation, halide ions and water. As used herein, the term "substantially free" as it relates to each impurity means 100 parts per million (ppm) or less, 50 ppm or less, 10 ppm or less, and 5 ppm or less, 1 ppm of less of each impurities such as without limitation, chloride or water.

The silacycloalkane compounds having Formula I according to the present invention and compositions comprising the silacycloalkane precursor compounds having Formula I according to the present invention are preferably substantially free of halide. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight) measured by ion chromatography (IC), preferably less than 3 ppm measured by IC, and more preferably less than 1 ppm measured by IC, and most preferably 0 ppm measured by IC. Chlorides are known to act as decomposition catalysts for the silacycloalkane compounds having Formulae I. Significant levels of chloride in the final product can cause the silacycloalkane precursor compounds to degrade. The gradual degradation of the silacycloalkane compounds may directly impact the film deposition process making it difficult for the semiconductor manufacturer to meet film specifications. In addition, the shelf-life or stability is negatively impacted by the higher degradation rate of the silacycloalkane compounds having Formula I thereby making it difficult to guarantee a 1-2 year shelf-life. Therefore, the accelerated decomposition of the silacycloalkane compounds having Formula I presents safety and performance concerns related to the formation of these flammable and/or pyrophoric gaseous byproducts. The silacycloalkane compounds having Formula I are preferably substantially free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "substantially free" as it relates to Li, Na, K, Mg, Ca, Al, Fe, Ni, Cr means less than 5 ppm (by weight), preferably less than 3 ppm, and more preferably less than 1 ppm, and most preferably 0.1 ppm as measured by ICP-MS. In some embodiments, the silacycloalkane compounds having Formula I are free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "free of" metal impurities as it relates to Li, Na, K, Mg, Ca, Al, Fe, Ni, Cr, noble metal such as volatile Ru or Pt complexes from ruthenium or platinum catalysts used in the synthesis, means less than 1 ppm, preferably 0.1 ppm (by weight) as measured by ICP-MS or other analytical method for measuring metals. The silacycloalkane compounds having Formula I are preferably also substantially free of water, as used herein, the term "substantially free" as it relates to water is less than 100 ppm as measured by Karl Fisher, preferably less than 50 ppm as measured by Karl Fisher, and more preferably less than 10 ppm as measured by Karl Fisher.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorosilanes, bromosilanes, or iodoslanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of or free of halides such as chlorides. Such methods are well described in the prior art and, may include, but are not limited to, purification processes such as distillation, or adsorption. Distillation is commonly used to separate impurities from the desired product by exploiting differences in boiling point. Adsorption may also be used to take advantage of the differential adsorptive properties of the components to effect separation such that the final product is substantially free of halide. Adsorbents such as, for example, commercially available $MgO$—$Al_2O_3$ blends can be used to remove halides such as chloride.

Whereas prior art silicon-containing structure-forming precursors such as, for example, DEMS polymerize once energized in the reaction chamber to form a structure having an —O-linkage (e.g., —Si—O—Si— or —Si—O—C—) in the polymer backbone, it is believed that silacycloalkane compounds such as, for example, the (1-methyl-1,2-ethanedioxy)-1-silacycloalkane molecules polymerize to form a structure where some of the —O— bridge in the backbone is replaced with a —$CH_2$— methylene or —$CH_2CH_2$— ethylene bridge(s). In films deposited using DEMS as the structure forming precursor where the carbon exists mainly in the form of terminal Si-Me groups there is a relationship between the % Si-Me (directly related to % C) versus mechanical strength where the replacement of a bridging Si—O—Si group with two terminal Si-Me groups decreases the mechanical properties because the network structure is disrupted. In the case of the alkyl-alkoxysilacycic compounds it is believed that the cyclic structure is broken either during the film deposition or the cure process (to remove at least a portion of, or substantially all, of the porogen precursor contained in the as-deposited film) to form SiCH$_2$Si or SiCH$_2$CH$_2$Si bridging groups. In this manner, one can incorporate carbon in the form of a bridging group so that, from a mechanical strength view, the network structure is not disrupted by increasing the carbon content in the film. Without intending to be bound by a particular theory, it is believed that this attribute adds carbon to the film, which allows the film to be more resilient to carbon depletion of the porous OSG film from processes such as etching of the film, plasma ashing of photoresist, and NH$_3$ plasma treatment of copper surfaces. Carbon depletion in the OSG films can cause defects in the dielectric constant of the film (e.g., an unintended increase), problems with film etching, and feature bowing during wet cleaning steps, and/or integration issues when depositing copper diffusion barriers.

The composition for depositing the dielectric film described herein comprises: from about 5 to about 60 weight percent of structure forming precursor comprising the silacycloalkane compound(s) having Formula I; and from about 40 to about 95 weight percent or porogen precursor depending on the nature of the porogen precursor.

In certain embodiments of the method and composition disclosed herein, the structure forming precursor further comprises a hardening additive which will increase the mechanical strength. Examples of hardening additives include tetraalkoxysilanes, such as for example, tetrethoxysilane (TEOS) or tetramethoxysilane (TMOS). In embodiments wherein a hardening additive is used, the composition of the structure forming portion comprises from about 30 to about 95 weight percent structure forming precursor comprising the silacycloalkane compound(s) having Formula I; from about 5 to about 70 weight percent of hardening additive; and about 40 to about 95 weight percent of the total precursor flow of porogen precursor.

As previously mentioned, the gaseous reagents further comprises one or more porogen precursors which is introduced into the reaction chamber along with the at least one structure-forming precursor comprising a silacycloalkane compound such as, for example, 1,1-dimethoxy-1-silacyclopentane. The following are non-limiting examples of materials suitable for use as porogens for use according to the present invention:

1) Cyclic hydrocarbons of the general formula $C_nH_{2n}$ where n=4-14, where the number of carbons in the cyclic structure is between 4 and 10, and where there can be a plurality of simple or branched hydrocarbons substituted onto the cyclic structure.

Examples include: cyclohexane, 1,2,4-trimethylcyclohexane, 1-methyl-4-(1-methylethyl)cyclohexane, cyclooctane, methylcyclooctane, methylcyclohexane, etc.

2) Linear or branched, saturated, singly or multiply unsaturated hydrocarbons of the general formula $C_nH_{(2n+2)-2y}$ where n=2-20 and where y=0-n.

Examples include: ethylene, propylene, acetylene, neohexane, 1,3-butadiene, 2-methyl-1,3-butadiene, 2,3-dimethyl-2,3-butadiene, substituted dienes, etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.

Examples include, para-cymene, cyclooctene, 1,5-cyclooctadiene, dimethyl-cyclooctadiene, cyclohexene, vinyl-cyclohexane, dimethylcyclohexene, alpha-terpinene, pinene, limonene, vinyl-cyclohexene, etc.

4) Bicyclic hydrocarbons of the general formula $C_nH_{2n-2}$ where n=4-14, where the number of carbons in the bicyclic structure is between 4 and 12, and where there can be a plurality of simple or branched hydrocarbons substituted onto the cyclic structure.

Examples include, norbornane, spiro-nonane, decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene, norbornadiene, 5-Ethylidene-2-norbornene etc.

6) Tricyclic hydrocarbons of the general formula $C_nH_{2n-4}$ where n=4-14, where the number of carbons in the tricyclic structure is between 4 and 12, and where there can be a plurality of simple or branched hydrocarbons substituted onto the cyclic structure.

Examples include adamantane.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In addition to the structure forming species and the pore-forming species, additional materials can be introduced into the reaction chamber prior to, during and/or after the deposition reaction. Such materials include, e.g., inert gas (e.g., He, Ar, N$_2$, Kr, Xe, etc., which may be employed as a carrier gas for lesser volatile precursors and/or which can promote the curing of the as-deposited materials and provide a more stable final film) and reactive substances, such as oxygen-containing species such as, for example, O$_2$, O$_3$, and N$_2$O, gaseous or liquid organic substances, NH$_3$, H$_2$, CO$_2$, or CO. In one particular embodiment, the reaction mixture introduced into the reaction chamber comprises the at least one oxygen source selected from the group consisting of O$_2$, N$_2$O, NO, NO$_2$, CO$_2$, water, H$_2$O$_2$, ozone, and combinations thereof. In an alternative embodiment, the reaction mixture does not comprise an oxidant.

Energy is applied to the gaseous reagents to induce the gases to react and to form the film on the substrate. Such energy can be provided by, e.g., plasma, pulsed plasma, helicon plasma, high density plasma, inductively coupled plasma, remote plasma, hot filament, and thermal (i.e., non-filament) and methods. A secondary rf frequency source can be used to modify the plasma characteristics at the substrate surface. Preferably, the film is formed by plasma enhanced chemical vapor deposition ("PECVD").

The flow rate for each of the gaseous reagents preferably ranges from 10 to 5000 sccm, more preferably from 30 to 1000 sccm, per single 200 mm wafer. The individual rates are selected so as to provide the desired amounts of structure-forming and porogen in the film. The actual flow rates needed may depend upon wafer size and chamber configuration, and are in no way limited to 200 mm wafers or single wafer chambers.

In some embodiments, the film is deposited at a deposition rate of about 50 nanometers (nm) per minute.

The pressure in the reaction chamber during deposition ranges from about 0.01 to about 600 torr or from about 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion wherein, e.g., a 5 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.0).

As previously mentioned, at least a portion of the porogen precursor to substantially all of the porogen precursor contained in the as-deposited film is removed in a subsequent removal step. The removal of the porogen precursor is performed by one or more of the following treatments: a thermal treatment, an ultraviolet treatment, an electron beam treatment, a gamma radiation treatment, and combinations thereof. In one particular embodiment, the porogen removing step is conducted by a UV treatment step, a thermal treatment step, or a combination thereof. In the latter embodiment, the UV treatment step occurs during at least a portion of the thermal treatment.

The removal of at least a portion to substantially all of the porogen contained within the as-deposited film is assumed if there is no statistically significant measured difference in atomic composition between the annealed porous OSG and the analogous OSG without added porogen. As used herein, the term "substantially free" as it relates to an removal of the porogen precursor in the as-deposited film means about 2% or less, or about 1% or less, or about 50 ppm or less or about 10 ppm or less or about 5 ppm or less of the porogen as measured by XPS or other means. The inherent measurement error of the analysis method for composition (e.g., X-ray photoelectron spectroscopy (XPS), Rutherford Backscattering/Hydrogen Forward Scattering (RBS/HFS)) and process variability both contribute to the range of the data. For XPS the inherent measurement error is Approx. +/−2 atomic %, while for RBS/HFS this is expected to be larger, ranging from +/−2 to 5 atomic % depending upon the species. The process variability will contribute a further +/−2 atomic % to the final range of the data.

Preferred embodiments of the invention provide a thin film material having a low dielectric constant and improved mechanical properties, thermal stability, and chemical resistance (to oxygen, aqueous oxidizing environments, etc.) relative to other porous low k dielectric films deposited using other structure forming precursors known in the art. The structure forming precursors described herein comprising the silacycloalkane compound(s) having Formula I provide a higher incorporation into the film of carbon (preferably predominantly in the form of organic carbon, —CH$_x$, where x is 1 to 3), whereby specific precursor or network-forming chemicals are used to deposit films. In certain embodiments, the majority of the hydrogen in the film is bonded to carbon.

The low k dielectric films deposited using the composition and method described herein comprise: (a) about 10 to about 35 atomic %, more preferably about 20 to about 30 atomic % silicon; (b) about 10 to about 65 atomic %, more preferably about 20 to about 45 atomic % oxygen; (c) about 10 to about 50 atomic %, more preferably about 15 to about 40 atomic % hydrogen; (d) about 5 to about 40 atomic %, more preferably about 10 to about 45 atomic % carbon. Films may also contain about 0.1 to about 15 atomic %, more preferably about 0.5 to about 7.0 atomic % fluorine, to improve one or more of materials properties. Lesser portions of other elements may also be present in certain films of the invention. OSG materials are considered to be low k materials as their dielectric constant is less than that of the standard material traditionally used in the industry—silica glass. The materials of the invention can be provided by adding pore-forming species or porogens to the deposition procedure, incorporating the porogens into the as-deposited (i.e., preliminary) OSG film and removing substantially all of the porogens from the preliminary film while substantially retaining the terminal Si—CH$_3$ groups or bridging —(CH$_2$)$_x$— of the preliminary film to provide the product film. The product film is porous OSG and has a dielectric constant reduced from that of the preliminary film as well as from an analogous film deposited without porogens. It is important to distinguish the film of the present invention as porous OSG, as opposed to a porous inorganic SiO$_2$, which lacks the hydrophobicity provided by the organic groups in OSG.

Silica produced by CVD TEOS, for example, has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Total porosity of the film may be from 5 to 75% depending upon the process conditions and the desired final film properties. Films of the invention preferably have a density of less than 2.0 g/ml, or alternatively, less than 1.5 g/ml or less than 1.25 g/ml. Preferably, films of the invention have a density at least 10% less than that of an analogous OSG film produced without porogens, more preferably at least 20% less.

The porosity of the film need not be homogeneous throughout the film. In certain embodiments, there is a porosity gradient and/or layers of varying porosities. Such films can be provided by, e.g., adjusting the ratio of porogen to precursor during deposition.

Films of the invention have a lower dielectric constant relative to common OSG materials with a dielectric constant ranging from 2.8 to 3.8. Preferably, films of the invention have a dielectric constant at least 0.3 less than that of an analogous OSG film produced without porogens, more preferably at least 0.5 less. Preferably a Fourier transform infrared (FTIR) spectrum of a porous film of the invention is substantially identical to a reference FTIR of a reference film prepared by a process substantially identical to the method except for a lack of any porogen.

Films of the invention may also contain fluorine, in the form of inorganic fluorine (e.g., Si—F). Fluorine, when present, is preferably contained in an amount ranging from 0.5 to 7 atomic %.

Films of the invention are thermally stable, with good chemical resistance. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer and/or an inter-metal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an inter-metal dielectric layer, a capping layer, a chemical-mechanical planarization (CMP) or etch stop layer, a barrier layer or an adhesion layer in an integrated circuit.

Although the films described herein are uniformly deposited dielectric films, the films as used in a full integration structure may actually consist of several sandwiched layers with for example a thin layer at the bottom or top which contains little or no porogen being deposited, or a layer may be deposited under conditions where there is a lower porogen precursor flow ratio alternatively for example a layer may be deposited at higher plasma power such that not all the porogen precursor can be removed by UV treatment. These sandwich layers may be utilized to enhance secondary integration properties such as for example adhesion, etch selectivity or electromigration performance.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive OSG products, the present invention includes the process by which the products are made, methods of using the products and compounds and compositions useful for preparing the products. For example, a process for making an integrated circuit on a semiconductor device is disclosed in U.S. Pat. No. 6,583,049, which is herein incorporated by reference.

The porogen in the deposited film may or may not be in the same form as the porogen introduced to the reaction chamber. As well, the porogen removal process may liberate the porogen or fragments thereof from the film. In essence, the porogen reagent (or porogen substituent attached to the precursor), the porogen in the preliminary film, and the porogen being removed may or may not be the same species, although it is preferable that they all originate from the porogen reagent (or porogen substituent). Regardless of whether or not the porogen is unchanged throughout the inventive process, the term "porogen" as used herein is intended to encompass pore-forming reagents (or pore-forming substituents) and derivatives thereof, in whatever forms they are found throughout the entire process of the invention.

Compositions of the invention can further comprise, e.g., at least one pressurizable vessel (preferably of stainless steel) fitted with the proper valves and fittings to allow the delivery of porogen, and (1-methyl-1,2-ethanedioxy)-1-silacyclopentane precursor to the process reactor. The contents of the vessel(s) can be premixed. Alternatively, porogen and precursor can be maintained in separate vessels or in a single vessel having separation means for maintaining the porogen and precursor separate during storage. Such vessels can also have means for mixing the porogen and precursor when desired.

The porogen is removed from the preliminary (or as-deposited) film by a curing step, which can comprise thermal annealing, chemical treatment, in-situ or remote plasma treating, photocuring (e.g., UV) and/or microwaving. Other in-situ or post-deposition treatments may be used to enhance material properties like hardness, stability (to shrinkage, to air exposure, to etching, to wet etching, etc.), integrity, uniformity and adhesion. Such treatments can be applied to the film prior to, during and/or after porogen removal using the same or different means used for porogen removal. Thus, the term "post-treating" as used herein denotes treating the film with energy (e.g., thermal, plasma, photon, electron, microwave, etc.) or chemicals to remove porogens and, optionally, to enhance materials properties.

The conditions under which post-treating are conducted can vary greatly. For example, post-treating can be conducted under high pressure or under a vacuum ambient.

UV annealing is a preferred method conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total UV annealing time is preferably from 0.01 min to 12 hours.

Chemical treatment of the OSG film is conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment for selective removal of porogens from an organosilicate film is conducted under the following conditions.

The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, a plasma comprising hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours.

UV curing for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths <200 nm). The total UV curing time is preferably 0.01 min to 12 hours.

Microwave post-treatment for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of porogens or specific chemical species from an organosilicate film and/or improvement of film properties is conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

The invention will be illustrated in more detail with reference to the following Examples, but it should be understood that the it is not deemed to be limited thereto.

EXAMPLES

Exemplary films or 200 mm wafer processing were formed via a plasma enhanced CVD (PECVD) process using an Applied Materials Precision-5000 system in a 200 mm DxZ reaction chamber or vacuum chamber that was fitted with an Advance Energy 200 RF generator from a variety of different chemical precursors and process conditions. The PECVD process generally involved the following basic steps: initial set-up and stabilization of gas flows, deposition of the film onto the silicon wafer substrate, and purge/evacuation of chamber prior to substrate removal. After the deposition, the films were subjected to UV annealing. UV annealing was performed using a Fusion UV system with a broad band UV bulb, with the wafer held under a helium gas flow at one or more pressures below <10 torr and at one or more temperatures <400° C. The experiments were conducted on p-type Si wafers (resistivity range=8-12 Ohm-cm).

Example 1: Synthesis of (1,2-ethanedioxy)-1-silacycopentane

To a three-neck 2 L round bottom flask equipped with stir bar was loaded 100 g (645 mmol) of 1,1-dichloro-1-silacyclopentane, followed by 1 L of anhydrous hexanes. To this flask was added a reflux condenser, an additional funnel, and an internal thermocouple, and the flask/contents were chilled to 0° C. 130.5 g (1,290 mmol) triethylamine was added to the addition funnel and added drop-wise to the 1,1-dichloro-1-silacyclopentane/hexanes mixture while maintaining the mixture at 0° C. Next, 40.0 g (645 mmol) of ethylene glycol (dried over mol sieves) was added to the addition funnel and added drop-wise while maintaining the mixture at 0° C. Upon completion, the resulting mixture was a thick white slurry and was left to warm to room temperature with vigorous stirring for 16 hours. The white slurry was filtered and the filtrate was subject to solvent removal using a distillation apparatus (50° C., 200 Torr). Product was purified by vacuum distillation.

Example 2: Synthesis of (1-methyl-1,2-ethanedioxy)-1-silacyclopetane

To a three-neck 2 L round bottom flask equipped with stir bar was loaded 100 g (645 mmol) of 1,1-dichloro-1-silacyclopentane, followed by 1 L of anhydrous hexanes. To this flask was added a reflux condenser, an additional funnel, and an internal thermocouple, and the flask/contents were chilled to 0° C. 130.5 g (1,290 mmol) triethylamine was added to the addition funnel and added drop-wise to the 1,1-dichloro-1-silacyclopentane/hexanes mixture while maintaining the mixture at 0° C. Next, 49.0 g (645 mmol) of 1,2-propanediol (dried over molsieves) was added to the addition funnel and added drop-wise while maintaining the mixture at 0° C. Upon completion, the resulting mixture was a thick white slurry and was left to warm to room temperature with vigorous stirring for 16 hours. The white slurry was filtered. Solvent removal was done using a distillation apparatus (50° C., 200 Torr). Product was distilled under vacuum (0.1 Torr)

with a vapor temperature of 70° C. The product was isolated in the amount of 76.1 g (49.7% yield) and was a viscous liquid. DSC indicated a boiling point of 224.3° C.

Example 3: Synthesis of (1,2-dimethyl-1,2-ethanedioxy)-1-silacyclopentane

To a three-neck 2 L round bottom flask equipped with stir bar was loaded 100 g (645 mmol) of 1,1-dichloro-1-silacyclopentane, followed by 1 L of anhydrous hexanes. To this flask was added a reflux condenser, an additional funnel, and an internal thermocouple, and the flask/contents were chilled to 0° C. 130.5 g (1,290 mmol) triethylamine was added to the addition funnel and added drop-wise to the 1,1-dichloro-1-silacyclopentane/hexanes mixture while maintaining the mixture at 0° C. Next, 58.0 g (645 mmol) of butane-2,3-diol (dried over mol sieves) was added to the addition funnel and added drop-wise while maintaining the mixture at 0° C. Upon completion, the resulting mixture was a thick white slurry and was left to warm to room temperature with vigorous stirring for 16 hours. The white slurry was filtered and the filtrate was subject to solvent removal using a distillation apparatus (50° C., 200 Torr). Product was purified by vacuum distillation.

Example 4: Deposition of Porous OSG Film from (1-methyl-1,2-ethanedioxy)-1-silacyclopentane and cyclooctane A composite layer of structure forming (1-methyl-1,2-ethanedioxy)-1-silacyclopentane and sacrificial porogen precursor cyclooctane is deposited using the following process conditions for 200 mm processing. The precursors are delivered to the reaction chamber via direct liquid injection (DLI) at flow rate of 960 mg/min cyclooctane and 240 mgm of (1-methyl-1,2-ethanedioxy)-1-silacyclopentane using 200 sccm Helium carrier gas flow, 20 sccm $O_2$, 350 milli-inch showerhead/wafer spacing, 250° C. wafer chuck temperature, 8 Torr chamber pressure to which a 600 W plasma is applied. After the deposition the resulting film is then UV annealed for 16 minutes at 400 C to remove the sacrificial porogen and mechanically enhance the film. Various attributes of the film (e.g., dielectric constant (k), porosity, modulus (GPa) and atomic weight percent carbon (% C)) are obtained as described above.

Example 5: Deposition of Porous OSG Film from (1,2-ethanedioxy)-1-silacyclopentane and cyclooctane A composite layer of structure forming (1,2-ethanedioxy)-1-silacyclopentane and porogen precursor cyclooctane is deposited using the following process conditions for 200 mm processing. The precursors are delivered to the reaction chamber via direct liquid injection (DLI) at flow rate of 960 mg/min cyclooctane and 240 mgm of (1,2-ethanedioxy)-1-silacyclopentane using 200 sccm He carrier gas flow, 20 sccm $O_2$, 350 milli-inch showerhead/wafer spacing, 250° C. wafer chuck temperature, 8 Torr chamber pressure to which a 600 W plasma is applied. After deposition the resulting film is then UV annealed for 16 minutes at 400 C to remove the sacrificial porogen and mechanically enhance the film. Various attributes of the film (e.g., dielectric constant (k), porosity, modulus (GPa) and atomic weight percent carbon (% C)) are obtained as described above.

Example 6: Deposition of a Dense OSG Film from (1-methyl-1,2-ethanedioxy)-1-silacyclopentane A layer of organosilicate glass (OSG) is deposited using (1-methyl-1,2-ethanedioxy)-1-silacyclopentane under the following process conditions for 200 mm processing. The precursor is delivered to the reaction chamber via direct liquid injection (DLI) at flow rate of 1200 mg/min of (1-methyl-1,2-ethanedioxy)-1-silacyclopentane using 200 sccm helium carrier gas flow, 20 sccm $O_2$, 350 milli-inch showerhead/wafer spacing, 250° C. wafer chuck temperature, 8 Torr chamber pressure to which a 600 W plasma is applied. After the deposition the attributes of the film (e.g., dielectric constant (k), modulus (GPa) and atomic weight percent carbon (% C)) are obtained as described above. The as-deposited film may also be further UV annealed at 400 C for 4 minutes in order to increase the mechanical properties.

Example 6: Deposition of a Dense OSG Film from (1,2-ethanedioxy)-1-silacyclopentane A layer of organosilicate glass (OSG) is deposited using (1,2-ethanedioxy)-1-silacyclopentane under the following process conditions for 200 mm processing. The precursor is delivered to the reaction chamber via direct liquid injection (DLI) at flow rate of 1200 mg/min of (1,2-ethanedioxy)-1-silacyclopentane using 200 sccm helium carrier gas flow, 20 sccm $O_2$, 350 milli-inch showerhead/wafer spacing, 250° C. wafer chuck temperature, 8 Torr chamber pressure to which a 600 W plasma is applied. After the deposition the attributes of the film (e.g., dielectric constant (k), modulus (GPa) and atomic weight percent carbon (% C)) are obtained as described above. The as-deposited film may also be further UV annealed at 400 C for 4 minutes in order to increase the mechanical properties.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges.

The invention claimed is:

1. A method for producing a dielectric film represented by the formula $Si_vO_wC_xH_yF_z$, where v+w+x+y+z=100%, v is from 10 to 35 atomic %, w is from 10 to 65 atomic %, x is from 5 to 40 atomic %, y is from 10 to 50 atomic % and z is from 0 to 15 atomic %, said method comprising:
 providing a substrate within a reaction chamber;
 introducing into the reaction chamber gaseous reagents comprising at least one structure-forming precursor comprising a silacycloalkane compound of Formula I

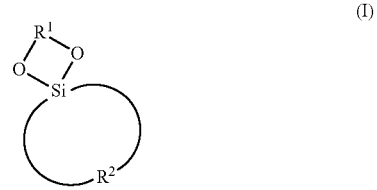

(I)

wherein $R^1$ is selected from a linear or branched $C_2$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^2$ is selected from a linear or branched $C_3$ to $C_{10}$ alkylene which forms a four-membered, five-membered, or six-membered saturated cyclic ring with the Si atom;

applying energy to the gaseous reagents in the reaction chamber to induce reaction of the gaseous reagents to deposit a preliminary film on the substrate to provide a dielectric film having a dielectric constant of about 3.2 or less.

2. The method of claim 1 wherein the gaseous reagents further comprise a hardening additive.

3. The method of claim 1 wherein the silacycloalkane compound comprises at least one selected from the group consisting of (1,2-ethanedioxy)-1-silacyclopentane, (1-methyl-1,2-ethanedioxy)-1-silacyclopentane, (1,2-dimethyl-1,2-ethanedioxy)-1-silacyclopentane, (1,1-methanedioxy)-1-silacyclopentane, (1-methyl-1,1-methanedioxy)-1-silacyclopentane, (1,3-propanedioxy)-1-silacyclopentane, (1-methyl-1,3-propanedioxy)-1-silacyclopentane, (1,3-dimethyl-1,3-propanedioxy)-1-silacyclopentane, (1,2-ethanedioxy)-1-silacyclobutane, (1-methyl -1,2-ethanedioxy)-1-silacyclobutane, (1,2-dimethyl-1,2-ethanedioxy)-1-silacyclobutane, (1,1-methanedioxy)-1-silacyclobutane, (1-methyl-1,1-methanedioxy)-1-silacyclobutane, (1,3-propanedioxy)-1-silacyclobutane, (1-methyl-1,3-propanedioxy)-1-silacyclobutane, (1,3-dimethyl -1,3-propanedioxy)-1-silacyclobutane, (1,2-ethanedioxy)-1-silacyclohexane, (1-methyl-1,2-ethanedioxy)-1-silacyclohexane, (1,2-dimethyl-1,2-ethanedioxy)-1-silacyclohexane, (1,1-methanedioxy)-1-silacyclohexane, (1-methyl-1,1-methanedioxy)-1-silacyclohexane, (1,3-propanedioxy)-1-silacyclohexane, (1-methyl-1,3-propanedioxy)-1-silacyclohexane, and (1,3-dimethyl-1,3-propanedioxy)-1-silacyclohexane, and combinations thereof.

4. The method of claim 1 wherein the gaseous reagents further comprise a porogen, which comprises cyclooctane.

5. The method of claim 2 wherein the hardening additive comprises tetraethoxysilane.

6. The method of claim 2 wherein the hardening additive comprises tetramethoxysilane.

7. The method of claim 1 which is a plasma enhanced chemical vapor deposition method.

8. The method of claim 1 where the gaseous reagents further comprise at least one oxygen source selected from the group consisting of $O_2$, $N_2O$, NO, $NO_2$, $CO_2$, CO, water, $H_2O_2$, ozone, and combinations thereof.

9. The method of claim 1 wherein the reaction chamber in the applying step contains at least one gas selected from the group consisting of He, Ar, $N_2$, Kr, Xe, $NH_3$, $H_2$, $CO_2$, and CO.

10. A film formed by the method of claim 1 wherein the film has a structure comprising at least one of —$CH_2$— methylene and —$CH_2CH_2$— ethylene bridges.

11. The method of claim 1, further comprising:
chemically treating the dielectric film after the steps of introducing the gaseous reagents and applying energy thereto to form the dielectric film, wherein the chemically treating step comprises treating using a fluorinating reagent.

12. The method of claim 1 wherein the gaseous reagents further comprise at least one porogen precursor selected from the group consisting of:

a.) a cyclic hydrocarbon having the formula $C_nH_{2n}$ wherein n=4-14 and wherein the cyclic hydrocarbon is unsubstituted or substituted with a plurality of a linear or a branched hydrocarbon;

b.) a linear or branched, saturated or singly or multiply unsaturated hydrocarbon of the general formula $C_nH_{(2n+2)-2y}$ wherein n=2-20 and wherein y=0-n;

c.) a singly or multiply unsaturated cyclic hydrocarbon having the formula $C_nH_{2n-2x}$ wherein x is the number of unsaturated sites in the molecule and n=4-14, and wherein the cyclic hydrogen is unsubstituted or substituted with a plurality of linear or branched hydrocarbons; and wherein if the cyclic hydrocarbon is unsaturated the unsaturation is located endocyclic or on one of the hydrocarbon substituents to the cyclic structure;

d.) a bicyclic hydrocarbon having the formula $C_nH_{2n-2}$ wherein n=4-14 and wherein the cyclic hydrocarbon is unsubstituted or substituted with a plurality of linear or branched hydrocarbons;

e.) a multiply unsaturated bicyclic hydrocarbon having the formula $C_nH_{2n-(2+2x)}$ wherein x is the number of unsaturated sites in the molecule, and n=4-14, wherein the number of carbons in the bicyclic structure is between 4 and 12, wherein the cyclic hydrocarbon is unsubstituted or substituted with a plurality of linear or branched hydrocarbons; and wherein if the hydrocarbon is unsaturated, the unsaturation is located endocyclic or on one of the hydrocarbon substituents to the cyclic structure; and f.) a tricyclic hydrocarbon having the formula $C_nH_{2n-4}$ wherein n=4-14, wherein the number of carbons in the tricyclic structure is between 4 and 12, and wherein the cyclic hydrocarbon is unsubstituted or substituted with a plurality of linear or branched hydrocarbons.

13. The method of claim 12 wherein the porogen precursor comprises at least one selected from the group consisting of cyclohexane, 1,2,4-trimethylcyclohexane, 1-methyl-4-(1-methylethyl)cyclohexane, cyclooctane, methylcyclooctane, ethylene, propylene, acetylene, neohexane, 1,3-butadiene, 2-methyl-1,3-butadiene, 2,3-dimethyl-2,3-butadiene, substituted dienes, para-cymene, cyclooctene, 1,5-cyclooctadiene, cyclohexene, vinyl-cyclohexane, dimethylcyclohexene, alpha-terpinene, pinene, limonene, vinyl-cyclohexene, norbornane, spiro-nonane, camphene, norbornene, norbornadiene, 5-ethylidene-2-norbornene, decahydronaphthalene, adamantine, and combinations thereof.

14. A composition for a vapor deposition of a dielectric film comprising at least one silacycloalkane compound having the following Formula I

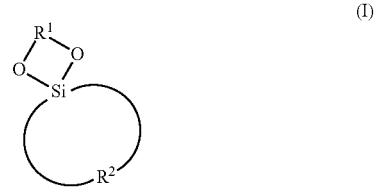

(I)

wherein $R^1$ is selected from a linear or branched $C_2$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^2$ is selected from a linear or branched $C_3$ to $C_{10}$ alkylene which forms a four-membered, five-membered, or six-membered saturated cyclic ring with the Si atom and wherein the compound is substantially free of one or more impurities selected from the group consisting of a halide, water, and combinations thereof.

15. The composition of claim 14 wherein the silacycloalkane compound comprises at least one selected from the group consisting of (1,2-ethanedioxy)-1-silacyclopentane, (1-methyl-1,2-ethanedioxy)-1-silacyclopentane, (1,2-dimethyl-1,2-ethanedioxy)-1-silacyclopentane, (1,1-methanedioxy)-1-silacyclopentane, (1-methyl-1,1-methanedioxy)-1-silacyclopentane, (1,3-propanedioxy)-1-silacyclopentane, (1-methyl-1,3-propanedioxy)-1-silacyclopentane, (1,3-dimethyl-1,3-propanedioxy)-1-silacyclopentane, (1,2-ethanedioxy)-1-silacyclobutane, (1-methyl -1,2-ethanedioxy)-1-silacyclobutane, (1,2-dimethyl-1,2-ethanedioxy)-1-silacyclobutane, (1,1-methanedioxy)-1-silacyclobutane, (1-methyl-1,1-methanedioxy)-1-silacyclobutane, (1,3-propanedioxy)-1-silacyclobutane, (1-methyl-1,3-propanedioxy)-1-silacyclobutane, (1,3-dimethyl -1,3-propanedioxy)-1-silacyclobutane, (1,2-ethanedioxy)-1-silacyclohexane, (1-methyl-1,2-ethanedioxy)-1-silacyclohexane, (1,2-dimethyl-1,2-ethanedioxy)-1-silacyclohexane, (1,1-methanedioxy)-1-silacyclohexane, (1-methyl-1,1-methanedioxy)-1-silacyclohexane, (1,3-propanedioxy)-1-silacyclohexane, (1-methyl-1,3-propanedioxy)-1-silacyclohexane, and (1,3-dimethyl-1,3-propanedioxy)-1-silacyclohexane, and combinations thereof.

16. The composition of claim 14, wherein the halide comprises chloride ions.

17. The composition of claim 14 further comprising at least one member selected from the group consisting of carrier gases and oxidants.

18. The composition of claim 17 wherein the member comprises at least one member selected from the group consisting of helium and oxygen.

19. The composition of claim 14 further comprising at least one hardening additive.

20. The composition of claim 19 wherein the hardening additive comprises at least one tetraalkoxysilane.

21. The composition of claim 14 further comprising a porogen.

22. The method of claim 12 further comprising removing at least some of the porogen precursor from the dielectric film by a treatment selected from the group consisting of a thermal treatment, an ultraviolet (UV) treatment, an electron beam treatment, a gamma radiation treatment, and a combination thereof.

23. The method of claim 22 wherein the UV treatment is included in the removing step and occurs during at least a portion of the thermal treatment.

* * * * *